United States Patent [19]

Brotherton et al.

[11] Patent Number: 4,605,447
[45] Date of Patent: Aug. 12, 1986

[54] METHODS OF MANUFACTURING SEMICONDUCTOR DEVICES

[75] Inventors: Stanley D. Brotherton, Forest Row; Audrey Gill, Horley; Michael J. King, Red Hill, all of England

[73] Assignee: U.S. Philips Corporation, New York, N.Y.

[21] Appl. No.: 604,285

[22] Filed: Apr. 26, 1984

[30] Foreign Application Priority Data

May 16, 1983 [GB] United Kingdom ............... 8313477

[51] Int. Cl.$^4$ .................. H01L 21/324; H01L 21/26
[52] U.S. Cl. ................... 148/1.5; 148/186; 148/188; 148/DIG. 15; 148/DIG. 24; 148/DIG. 125; 148/DIG 128; 29/576 B; 29/576 T; 29/578
[58] Field of Search .............. 29/576 B, 576 T, 578, 29/584; 148/1.5, 186, 188, DIG. 3, DIG. 15, DIG. 24, DIG. 128, DIG. 125, DIG. 127; 427/39, 93, 95, 82; 156/643

[56] References Cited

U.S. PATENT DOCUMENTS

| | | | |
|---|---|---|---|
| 4,013,485 | 3/1977 | Ma et al. | 29/584 |
| 4,224,084 | 9/1980 | Pankove | 148/1.5 |
| 4,234,355 | 11/1980 | Meinders | 29/584 |
| 4,266,986 | 5/1981 | Benton et al. | 148/1.5 |
| 4,331,486 | 5/1982 | Chenevas-Paule et al. | 29/576 T |
| 4,331,709 | 5/1982 | Risch et al. | 427/39 |
| 4,364,779 | 12/1982 | Kamgar et al. | 148/1.5 |
| 4,371,587 | 2/1982 | Peters | 427/93 |
| 4,447,272 | 5/1985 | Saks | 29/576 T |

OTHER PUBLICATIONS

Danesh et al., "Hydrogen Passivation of the Implantation Defects in MOS Structures,", Radiation Effect Lett. vol. 86, 3/84.
Tarng et al., "Passivation of P-N Junctions in c-Si by Amorphous Silicon," IEEE Trans. Electr. Device vol. ED-26, No. 11, Nov. 79.
Kastl et al., "Ion Implantation Diffusion Source", IBM Tech. Discl. Bull. vol. 16, No. 4, Sep. 73.
Pankove et al., "Amorphous Si as a Passivant for Crystalline Si" Applied Phys. Lett. 34(2) Jan. 79.
Weitzel et al, "Preparation of Glow Discharge Amorphous Si for Passivation Layers", Thin Solid Films, 75 (1981) 143–150.

Primary Examiner—Brian E. Hearn
Assistant Examiner—Hunter L. Auyang
Attorney, Agent, or Firm—Paul R. Miller

[57] ABSTRACT

A plasma and heating treatment is carried out to reduce the density of charge carrier traps adjacent the interface of an insulating layer of a thermally grown silicon dioxide and a semiconductor body. During this plasma and heating treatment, the device is covered with an additional layer of silicon containing hydrogen, such as silane, for example, and this additional layer protects the insulating layer from direct bombardment of the plasma. During and/or after the plasma treatment, heating of the structure is at about 400° C. or less. After the plasma and heating treatment, the additional layer is removed from at least most parts of the semiconductor device structure.

26 Claims, 3 Drawing Figures

METHODS OF MANUFACTURING SEMICONDUCTOR DEVICES

This invention relates to methods of manufacturing a semiconductor device in which a semiconductor device structure is formed adjacent a major surface of a semiconductor body and includes an insulating layer at said major surface, and a plasma and heating treatment is performed to reduce the density of charge carrier traps adjacent the interface of the insulating layer and the semiconductor body. Such methods are particularly important for the manufacture of devices such as charge-transfer devices and insulated-gate field-effect transistor circuits in which electrodes are formed on the insulating layer and serve to control the passage of charge carriers in the underlying portion of the body by capacitive coupling across the insulating layer.

BACKGROUND OF THE INVENTION

The high density of charge-carrier traps adjacent the interface of an insulating layer and a silicon semiconductor device body plays a major role in determining the magnitude of the dark current in imaging devices, the low-current gain in bipolar devices, storage times in memories and noise in insulated-gate field-effect transistors, and results in charge transfer inefficiency which limits the application of silicon charge-coupled devices particularly of the surface channel type in memory, filter and image-sensing integrated circuits. These charge traps (also called 'fast surface states') appear to result from silicon atoms which are only trivalently bonded at the interface. The insulating layer is typically of thermally grown silicon dioxide or another compound of the semiconductor material, and similar trivalent bonding can occur in the insulating layer to produce traps deeper in the insulating layer.

It is conventional practice to anneal these surface states between a thermally grown silicon dioxide layer and a silicon body by heating the body with the layer to a temperature not exceeding about 500° C. in an atmosphere of hydrogen, or a hydrogen-nitrogen mixture, or wet nitrogen. The hydrogen is thought to saturate the remaining dangling bond of trivalently bonded silicon atoms. In this manner the density $N_{ss}$ of the traps with thermally grown silicon dioxide layers on silicon devices can be reduced to between $10^9$ and $10^{10}$ $cm^{-2}.eV^{-1}$. However hydrogen does not diffuse readily through silicon nitride layers, and so a plasma and heating treatment has been tried with silicon nitride layers by Goascoz et al of the Laboratoire d'Electronique et de Technologie de l'Informatique, Laboratoire de Microélectronique Appliquée as described in Note Technique LETI/MEA No. 1356, Oct. 5, 1979, which was presented at ESSDERC, Munich 1979.

In this known annealing treatment for silicon nitride layers, a high frequency plasma system similar to a conventional r.f. sputtering system is used to produce atomic hydrogen species. The device sample is maintained in the glowing area of the hydrogen plasma on a heated mount. The device samples used were either MNS capacitors comprising a metal electrode on a larger area silicon nitride layer on a silicon substrate or MNOS memory capacitors comprising a metal electrode on a larger area silicon nitride layer on a very thin silicon dioxide layer on a silicon substrate. Reference samples which were not subjected to the plasma treatment had a surface state density $N_{ss}$ of $1.5 \times 10^{12}$ $cm^{-2}.eV^{-1}$ for the MNS capacitor and $6 \times 10^{11}$ $cm^{-2}.eV^{-1}$ for the MNOS capacitor. When the plasma treatment was effected $N_{ss}$ of both samples were reduced to about $10^{10}$ $cm^{-2}.eV^{-1}$ with the samples heated to 400° C. and less than $10^9$ $cm^{-2}$ $eV^{-1}$ with samples heated to 500° C.

SUMMARY OF THE INVENTION

According to the present invention there is provided a method of manufacturing a semiconductor device in which a semiconductor device structure is formed adjacent a major surface of a semiconductor body and includes an insulating layer at the major surface, and a plasma and heating treatment is performed to reduce the density of charge carrier traps adjacent the interface of the insulating layer and the semiconductor body, characterized in that during the plasma and heating treatment the semiconductor device structure is covered by an additional layer which protects the insulating layer from direct bombardment by the plasma, and after the plasma and heating treatment the additional layer is removed from at least most areas of the semiconductor device structure.

By covering the semiconductor device structure with the protective additional layer during the plasma and heating treatment very low surface state densities ($N_{ss}$ less than $10^9$ $cm^{-2}.eV^{-1}$) can be obtained for thermally-grown silicon dioxide insulating layers on silicon device bodies without a significant increase in the flatband voltage. The heating of the body may be kept to a temperature not exceeding 500° C. or even 400° C. or less. The heating may be effected during and/or after the plasma treatment.

The additional layer may contain hydrogen and may be of polycrystalline silicon which can be easily provided and subsequently removed from the semiconductor device structure since it is selectively etchable with respect to commonly used insulating layers. At least in the case of silicon devices this layer of silicon is preferably deposited by decomposition of silane. In this latter case, the deposited layer has a hydrogen content which may become activated during the plasma bombardment to saturate dangling bonds of trivalently-bonded silicon adjacent the interface of the insulating layer and the silicon body.

Although the reduction of surface states achievable in a method in accordance with the invention is of advantage for many types of devices including bipolar devices, it is particularly useful for CCDs, MOSTs and similar devices in which there is formed on the insulating layer at least one electrode which serves in the manufactured device to control the passage of charge carriers in the underlying portion of the body by capacitive coupling across the insulating layer.

BRIEF DESCRIPTION OF THE DRAWINGS

Embodiments of the invention to illustrate these and other features in accordance with the present invention will now be described, by way of example, with reference to the accompanying drawings, in which.

DESCRIPTION OF THE PREFERRED EMBODIMENTS

Figure 1:
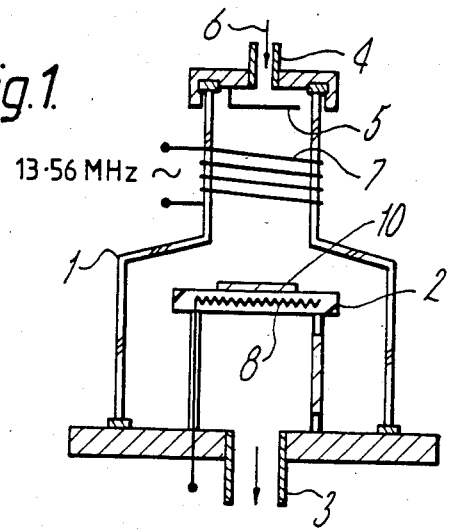
FIG. 1 is a diagrammatic cross-sectional view of a plasma chamber for use in a method in accordance with the invention.

In the semiconductor device manufacture now to be described, a semiconductor device structure is formed at a major surface 11 of a semiconductor body 10 and includes an insulating layer 12 at the major surface, and a plasma and heating treatment in accordance with the present invention is performed to reduce the density $N_{ss}$ of charge carrier traps adjacent the interface of the insulating layer 12 and the semiconductor body 10. The plasma stage and at least part of the heating stage of this trap annealing treatment may be effected in the equipment illustrated in FIG. 1.

This equipment comprises a silica reaction chamber 1 in which the plasma is generated and which contains a heated support 2 for the semiconductor device body 10. The chamber 1 is evacuated through an outlet 3 connected to a vacuum pump, while gas 6 from which the plasma is generated is bled into the chamber 1 via an inlet 4 and a baffle 5. The plasma is produced using a R. F. generator inductively coupled to the gas 6 by a coil 7 around the neck of the chamber 1 above the support 2. The support 2 is in the luminescent area of the plasma. The support 2 contains an electrical heating element 8 by which it can be heated to a desired temperature during the trap-annealing treatment.

Figure 2:
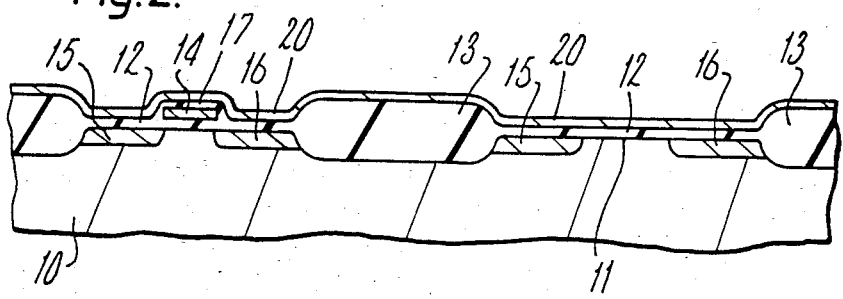
FIGS. 2 and 3 are diagrammatic cross-sectional views of part of a semiconductor body at two stages during the manufacture of a semiconductor device by a method in accordance with the present invention.
Figure 3:
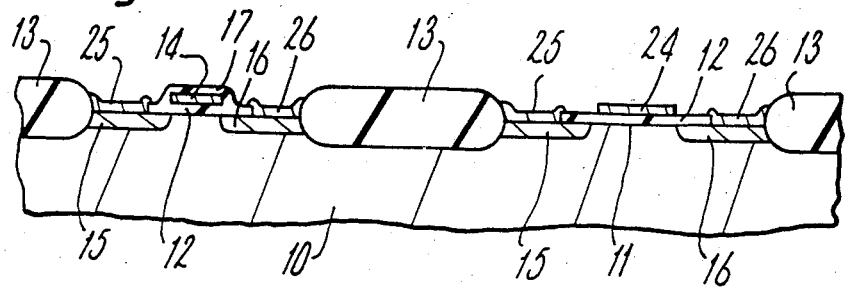

In the example illustrated in FIGS. 2 and 3, an integrated circuit comprising insulated-gate field-effect transistors is being manufactured. The transistors are formed at areas surrounded by a thick insulating layer 13, for example of thermally-grown silicon dioxide, at the major surface 11 of the body 10 which is of monocrystalline silicon. Two such transistor areas are shown in FIGS. 2 and 3, and for the sake of illustration the gate electrodes of these transistors will be formed differently, one before the annealing treatment and the other afterwards. The thinner insulating layer 12 which provides a gate oxide layer of the transistors is formed of thermally-grown silicon dioxide at the surface of these areas surrounded by the layer 13.

A polycrystalline silicon layer 14 forms the gate electrode of the left-hand transistor. FIG. 2 illustrates the structure after the formation of the source and drain regions 15 and 16 respectively of the transistors. The regions 15 and 16 are formed in known manner, for example by ion implantation. The surface of the polycrystalline silicon gate electrode 14 is provided in known manner with a silicon dioxide coating 17. FIG. 2 illustrates the structure at the stage of performing the plasma and heating treatment to anneal charge-carrier traps which have been formed adjacent the interface of the gate oxide layer 12 and the channels of both the left-hand and right-hand transistors. In preparation for this plasma and heating treatment, an additional layer 20 is deposited over the semiconductor device structure including the insulating layers 12, 13 and 17, see FIG. 2.

The protective additional layer 20 preferably contains hydrogen and can be deposited in a simple manner as polycrystalline silicon formed by the decomposition of silane, $SiH_4$. Preferably this silicon additional layer 20 has a thickness of more than 0.2 micrometers and less than 0.6 micrometers. In accordance with the present invention, the device structure so far formed is covered by this layer 20 during the plasma and heating treatments. The layer 20 serves to protect the gate oxide layer 12 from direct bombardment by the plasma. This is important not only for the right-hand transistor where the whole gate oxide area would otherwise be exposed to the plasma bombardment, but is also important for the left-hand transistor where the gate electrode 14 is already present.

Although not entirely understood, the gate oxide layer 12 of even the left-hand transistor appears to be damaged by the plasma bombardment in the absence of this additional layer 20, and this prevents a significant reduction in the trap density $N_{ss}$ and can significantly increase the flat-band voltage. As well as its protective role, the layer 20 may also act as a beneficial source of plasma-activated or plasma-injected atomic hydrogen which it is thought may saturate dangling silicon bonds during the heating phase of the treatment. By including the layer 20, very low trap densities ($N_{ss}$ less than $10^9$) can be obtained even with the heating phase or phases kept to temperatures not exceeding 400° C., and without significant increase in the flat-band voltage.

The body 10 with the additional layer 20 is mounted on the support 2 of the chamber 1 of FIG. 1 and maintained in a hydrogen plasma, for example at a pressure of 0.2 Torr (about 26.7 Pa) for about 30 minutes while the body 10 is maintained at about 300° C. by means of the support heater 8. Under these conditions fast surface state densities $N_{ss}$ (near the middle of the band-gap) as low as 3 to $5 \times 10^8$ $cm^{-2}.eV^{-1}$ can be reproducibly obtained in a manufacturing process. After the plasma phase, the heating phase of the treatment may be continued in the presence of the additional layer 20, for example by heating at 300° C. for 30 minutes in a nitrogen ambient.

After the plasma and heating treatment the temperature of the body is maintained below the heating treatment temperature(s) for the remaining steps in the manufacture of the device. These remaining steps include removing the additional layer 20 from at least most areas of the insulating layer 12, providing the gate electrode 24 of the right-hand transistor of FIG. 3, etching contact windows in the insulating layer 12, and depositing source and drain electrodes 25,26 to contact the source and drain regions 15,16. The layer 20 is preferably entirely removed so that a masking step is not necessary. However, if desired, the layer 20 may be kept in for example peripheral areas of the body or/and may even provide the gate electrode layer 24 of the right-hand transistor. However, preferably the gate electrode 24 is provided after the removal of the layer 20, for example in metal deposition, photolithographic and etching steps which are also used to provide the source and drain electrodes 25 and 26.

Experiments to illustrate the effectiveness of providing the protective additional layer 20 in accordance with the present invention have also been conducted on an MOS capacitor test structure having a polycrystalline silicon gate electrode 14 on a thermally-grown insulating layer 12 of silicon dioxide on a silicon body portion 10. In this test structure the body portion was of n-type silicon having a uniform doping concentration of $10^{15}$ $atoms.cm^{-3}$. The silicon dioxide layer 12 was 0.14 micrometers thick. This capacitor test structure was fabricated on three separate silicon wafers A, B and C.

Before depositing the capacitor electrode, the insulating layer 12 of wafer A was coated with a 0.4 micrometer thick layer 20 of polycrystalline silicon formed from silane and was subjected to a plasma and heating treatment in the presence of this additional layer 20 to anneal the fast surface states adjacent the interface of the insulating layer 12 and body portion 10. A hydrogen plasma at a pressure of 0.2 Torr (about 26.7 Pa) was used with the body on the support 2 being heated to 300° C. A R. F. signal of 13.56 MHz at a power of 300 watts was used to generate the plasma. After removal from the plasma a subsequent heating phase of the treatment, also at 300° C. for 30 minutes, was performed in a nitrogen ambient.

With wafer B the MOS capacitor test structure was fabricated in the same manner as for wafer A but without the additional silicon layer 20 during the plasma and heating treatment. Apart from the absence of the layer 20 the test structure of wafer B was subjected to the same conditions of plasma and heating. With wafer C the MOS capacitor test structure was fabricated in the same manner as for wafer A including the provision of the additional silicon layer 20, but without the plasma phase of the plasma and heating treatment. The test structure of wafer C was instead heated for 30 minutes at 300° C. on the support 2 of FIG. 1 in a hydrogen atmosphere, but without activating the coil 7 to generate any plasma.

The magnitude of the peak in the conductance-voltage curves measured for these capacitor test structures were used to provide an indication of the interface trap density $N_{ss}$. The peak for wafer A having a capacitor structure manufactured in accordance with the invention was equivalent to $N_{ss}$ of about $4.2 \times 10^8$ cm$^{-2}$.eV$^{-1}$; whereas much larger peaks were measured for wafers B and C, equivalent to $N_{ss}$ of $7.3 \times 10^{11}$ cm$^{-2}$.eV$^{-1}$ and $2.6 \times 10^{10}$ cm$^{-2}$.eV$^{-1}$ respectively. Thus, with these low annealing temperatures, the inclusion of the plasma phase without the layer 20 (wafer B) is worse than not including the plasma phase (wafer C), and a very low density of charge carrier traps $N_{ss}$ (wafer A) is only obtained when both the plasma phase and the protective additional layer 20 are included. Without the protective layer 20 the flat-band voltage for wafer B was increased to just over 10 volts as compared with 0.5 volts for wafer A.

A comparison was also made with an MOS capacitor test structure in which the interface traps were reduced by a conventional annealing treatment involving heating the test structure at 400° C. for 40 minutes in wet nitrogen (i.e. nitrogen containing water vapour). In this case, $N_{ss}$ of $1.6 \times 10^{10}$ cm$^{-2}$.eV$^{-1}$ was obtained which is only a slight improvement on wafer C and significantly worse than wafer A.

Another comparison was made between the conventional (wet nitrogen) annealing treatment and the plasma and heating treatment using an additional layer 20 in accordance with the invention. This comparison involved annealing the charge-traps at the interface of the insulating layer and silicon body of a surface channel charge-coupled device. The body also included an MOS gated diode test structure for which the surface generation currents were measured. With a polycrystalline silicon gate electrode the surface generation current was $4.5 \times 10^{-9}$ A.cm$^{-2}$ for the body subjected to the conventional (wet nitrogen) treatment and $1.4 \times 10^{-10}$ A.cm$^{-2}$ for the body subjected to the treatment in accordance with the invention. With an aluminium gate electrode the currents were $2.1 \times 10^{-9}$ A.cm$^{-2}$ for the conventional (wet bake) treatment and $2.4 \times 10^{-10}$ A.cm$^{-2}$ for the treatment in accordance with the invention. The polycrystalline silicon gate electrode was formed before the annealing treatment was performed, whereas the aluminium electrode was formed afterwards. The charge-transfer efficiency of the CCD line was also appreciably improved for the device structure fabricated in accordance with the present invention using an additional layer 20 during the plasma and heating treatment.

Although in a method in accordance with the invention a hydrogen-containing plasma is preferred, a nitrogen or other plasma not containing hydrogen may be used in a method in accordance with the invention at least when the additional layer contains hydrogen as is the case with a silicon layer formed by the decomposition of silane. In this case the non-hydrogen containing plasma is thought to activate the hydrogen in the layer 20 which migrates to the interface during the heating. However, another mechanism may also be at least partly responsible, in which the plasma serves as an excitation source generating electron-hole pairs in the layer 20 and the movement and recombination of these electrons and holes adjacent the interface may release energy which helps to anneal the interface states. Such a mechanism is described in U.S. Pat. No. 4,013,485 and a related article in Applied Physics Letters, Vol. 32, No. 7, Apr. 1, 1978, pages 441 to 444.

We claim:
1. A method of manufacturing a semiconductor device comprising the steps of
   forming an insulating layer at a major surface of a semiconductor body,
   covering said insulating layer by an additional layer of polycrystalline silicon,
   performing a plasma and heating treatment to reduce the density of charge carrier traps adjacent the interface of said insulating layer and said semiconductor body, said insulating layer being protected by said additional layer from direct bombardment by said plasma, and
   removing said additional layer from at least most areas of said insulating layer following said plasma and heating treatment.

2. A method according to claim 1, wherein said additional layer contains hydrogen.

3. A method according to claim 2, wherein said additional layer is silicon deposited by decomposition of silane.

4. A method according to claim 3, wherein said additional layer of silicon has a thickness of more than 0.2 micrometers and less than 0.6 micrometers.

5. A method according to claim 1, wherein said additional layer is silicon deposited by decomposition of silane.

6. A method according to claim 5, wherein said additional layer of silicon has a thickness of more than 0.2 micrometers and less than 0.6 micrometers.

7. A method according to claim 1, wherein said insulating layer is silicon dioxide.

8. A method according to claim 1, wherein said plasma contains hydrogen.

9. A method according to claim 1, wherein said step of performing a plasma and heating treatment comprises heating said semiconductor body to a temperature not exceeding 500° C. while maintaining said body in said plasma.

10. A method according to claim 9, wherein said step of performing a plasma and heating treatment includes heating said semiconductor body to a temperature not exceeding 500° C. after removing said body from said plasma.

11. A method according to claim 1, wherein said step of performing a plasma and heating treatment includes heating said semiconductor body to a temperature not exceeding 500° C. after removing said body from said plasma.

12. A method according to claim 1, wherein after said step of performing a plasma and heating treatment, said semiconductor body is maintained at a temperature below 500° C. for remaining steps in the manufacture of the semiconductor device.

13. A method of manufacturing a semiconductor device comprising the steps of
forming an insulating layer at a major surface of a semiconductor body,
covering said insulating layer by an additional layer of polycrystalline silicon,
performing a plasma and heating treatment to reduce the density of charge carrier traps adjacent the interface of said insulating layer and said semiconductor body, said insulating layer being protected by said additional layer from direct bombardment by said plasma, and
removing said additional layer entirely from said insulating layer and semiconductor body following said plasma and heating treatment.

14. A method of manufacturing a semiconductor device comprising the steps of
forming an insulating layer at a major surface of a semiconductor body,
covering said insulating layer by an additional layer of polycrystalline silicon,
performing a plasma and heating treatment to reduce the density of charge carrier traps adjacent the interface of said insulating layer and said semiconductor body, said insulating layer being protected by said additional layer from direct bombardment by said plasma,
removing said additional layer from at least most areas of said insulating layer following said plasma and heating treatment, and
forming at least one electrode on said insulating layer after removing said additional layer, said electrode serving to control passage of charge carriers in underlying portions of said semiconductor body by capacitive coupling across said insulating layer.

15. A method of manufacturing a semiconductor device comprising the steps of
forming an insulating layer at a major surface of a semiconductor body,
forming at least one electrode on said insulating layer, said electrode serving to control passage of charge carriers in underlying portions of said semiconductor body by capacitive coupling across said insulating layer,
covering said insulating layer and said electrode by an additional layer of polycrystalline silicon,
performing a plasma and heating treatment to reduce the density of charge carrier traps adjacent the interface of said insulating layer and said semiconductor body, said insulating layer being protected by said additional layer from direct bombardment by said plasma, and
removing said additional layer from at least most areas of said insulating layer following said plasma and heating treatment.

16. A method according to claim 13 or claim 14 or claim 15, wherein said additional layer contains hydrogen.

17. A method according to claim 16, wherein said additional layer is silicon deposited by decomposition of silane.

18. A method according to claim 17, wherein said additional layer of silicon has a thickness of more than 0.2 micrometers and less than 0.6 micrometers.

19. A method according to claim 13 or claim 14 or claim 15, wherein said additional layer is silicon deposited by decomposition of silane.

20. A method according to claim 19, wherein said additional layer of silicon has a thickness of more than 0.2 micrometers and less than 0.6 micrometers.

21. A method according to claim 13 or claim 14 or claim 15, wherein said insulating layer is silicon dioxide.

22. A method according to claim 13 or claim 14 or claim 15, wherein said plasma contains hydrogen.

23. A method according to claim 13 or claim 14 or claim 15, wherein said step of performing a plasma and heating treatment comprises heating said semiconductor body to a temperature not exceeding 500° C. while maintaining said body in said plasma.

24. A method according to claim 23, wherein said step of performing a plasma and heating treatment includes heating said semiconductor body to a temperature not exceeding 500° C. after removing said body from said plasma.

25. A method according to claim 13 or claim 14 or claim 15, wherein said step of performing a plasma and heating treatment includes heating said semiconductor body to a temperature not exceeding 500° C. after removing said body from said plasma.

26. A method according to claim 13 or claim 14 or claim 15, wherein after said step of performing a plasma and heating treatment, said semiconductor body is maintained at a temperature below 500° C. for remaining steps in the manufacture of the semiconductor device.

* * * * *